(12) United States Patent
Valcozzena et al.

(10) Patent No.: US 11,987,901 B2
(45) Date of Patent: May 21, 2024

(54) METHODS FOR FORMING A SILICON SUBSTRATE WITH REDUCED GROWN-IN NUCLEI FOR EPITAXIAL DEFECTS AND METHODS FOR FORMING AN EPITAXIAL WAFER

(71) Applicant: GlobalWafers Co., Ltd., Hsinchu (TW)

(72) Inventors: Pietro Valcozzena, Agordo (IT); Maria Porrini, Merano (IT); Januscia Duchini, Marlengo (IT)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 17/711,691

(22) Filed: Apr. 1, 2022

(65) Prior Publication Data

US 2022/0220636 A1 Jul. 14, 2022

Related U.S. Application Data

(62) Division of application No. 17/125,590, filed on Dec. 17, 2020.

(Continued)

(51) Int. Cl.
*C30B 29/06* (2006.01)
*C30B 15/00* (2006.01)
(Continued)

(52) U.S. Cl.
CPC ............ *C30B 29/06* (2013.01); *C30B 15/007* (2013.01); *C30B 15/04* (2013.01); *C30B 15/14* (2013.01);
(Continued)

(58) Field of Classification Search
CPC ....... C30B 29/06; C30B 15/007; C30B 15/04; C30B 15/14; C30B 15/203; C30B 29/607; C30B 25/10; C30B 25/20
See application file for complete search history.

(56) References Cited

U.S. PATENT DOCUMENTS 6,066,306 A   5/2000   Iida et al.
6,284,039 B1  9/2001   Mule'Stagno et al.
(Continued)

FOREIGN PATENT DOCUMENTS

JP   H11130592 A      5/1999
JP   2002064102 A  *  2/2002
(Continued)

OTHER PUBLICATIONS

K. Sueoka, M. Akatsuka, T. Ono, E. Asayama, Y. Koike, N. Adachi, S. Sadamitsu, and H. Katahama, "Oxygen Precipitation Behavior and its Optimum Condition for Internal Gettering and Mechanical Strength in Epitaxial and Polished Silicon Wafers", Electrochemical Society Proceedings, vol. 2000-17, pp. 164-179, (2000).

(Continued)

*Primary Examiner* — Hua Qi
(74) *Attorney, Agent, or Firm* — Armstrong Teasdale LLP

(57) ABSTRACT

Methods for preparing single crystal silicon substrates for epitaxial growth are disclosed. The methods may involve control of the (i) a growth velocity, v, and/or (ii) an axial temperature gradient, G, during the growth of an ingot segment such that v/G is less than a critical v/G and/or is less than a value of v/G that depends on the boron concentration of the ingot. Methods for preparing epitaxial wafers are also disclosed.

16 Claims, 7 Drawing Sheets

Related U.S. Application Data

(60) Provisional application No. 63/112,424, filed on Nov. 11, 2020.

(51) Int. Cl.
*C30B 15/04* (2006.01)
*C30B 15/14* (2006.01)
*C30B 15/20* (2006.01)
*C30B 29/66* (2006.01)
*C30B 25/10* (2006.01)
*C30B 25/20* (2006.01)

(52) U.S. Cl.
CPC ............ *C30B 15/203* (2013.01); *C30B 29/66* (2013.01); *C30B 25/10* (2013.01); *C30B 25/20* (2013.01)

(56) References Cited

U.S. PATENT DOCUMENTS

| | | | | |
|---|---|---|---|---|
| 6,458,202 | B1* | 10/2002 | Kojima | C30B 29/06 117/207 |
| 6,547,875 | B1 | 4/2003 | Nakajima et al. | |
| 6,569,237 | B2 | 5/2003 | Tanaka et al. | |
| 7,846,253 | B2 | 12/2010 | Koike | |
| 2002/0084451 | A1* | 7/2002 | Mohr | C30B 29/06 257/1 |
| 2003/0157341 | A1 | 8/2003 | Ikezawa et al. | |
| 2006/0005762 | A1* | 1/2006 | Maeda | C30B 29/06 117/14 |
| 2007/0269361 | A1* | 11/2007 | Kulkarni | C30B 15/00 117/931 |
| 2008/0236476 | A1* | 10/2008 | Murakami | C30B 15/203 117/20 |
| 2011/0263126 | A1 | 10/2011 | Harada et al. | |
| 2015/0044467 | A1 | 2/2015 | Jo et al. | |

FOREIGN PATENT DOCUMENTS

| | | |
|---|---|---|
| JP | 2002064102 A | 2/2002 |
| JP | 2004165489 A | 6/2004 |
| JP | 2005170778 A | 6/2005 |

OTHER PUBLICATIONS

V. V. Voronkov and R. Falster, "Vacancy and Self-Interstitial Concentration Incorporated into Growing Silicon Crystals", Journal of Applied Physics, vol. 86 (11), pp. 5975-5982, (1999).
V. V. Voronkov and R. Falster, "Grown-in Microdefects, Residual Vacancies and Oxygen Precipitation Bands in Czochralski Silicon", Journal of Crystal Growth 204, pp. 462-474, (1999).
V. V. Voronkov, "The Mechanism of Swirl Defects Formation in Silicon", Journal of Crystal Growth, vol. 59, pp. 625-643, (1982).
Erich Dornberger and Wilfred V. Ammon, "The Dependence of Ring Like Distributed Stacking Faults on The Axial Temperature Gradient of Growing Czochralski Silicon Crystals", Electrochemical Society Proceedings, vol. 95-4, pp. 294-305, (1995).
Wilfried Von Ammon, Erich Dornberger, Hans Oelkrug and Herbert Weidner, "The Dependence of Bulk Defects on the Axial Temperature Gradient of Silicon Crystals During Czochralski Growth", Journal of Crystal Growth, vol. 151, pp. 273-277, (1995).
R. Falster, V.V. Voronkov, R. Quast, "On the Properties of the Intrinsic Point Defects in Silicon: A Perspective from Crystal Growth and Wafer Processing", Physica status solidi, (b) 222, pp. 219-244, (2000).
G. Borionetti, D. Gambaro, S. Santi, M. Borgini, P. Godio, S Pizzini, "Crystal Related Defects Evolution During Thin Epitaxial Layer Growth on Silicon Wafers", Materials, Science and Engineering B 73, pp. 218-223, (2000).
G. Borionetti, D. Gambaro, M. Porrini, V.V. Voronkov, "Grown-in Microdefects Distribution in Doped Silicon Crystals", Electrochemical Society Proceedings, vol. 2002-2, pp. 505-516, (2000).
A.J.R. De Kock, W.M. Van De Wijgert. "The Effect of Doping on the Formation of Swirl Defects in Dislocation-Free Czochralski-Grown Silicon Crystals", Journal of Crystal Growth, vol. 49, pp. 718-734, (1980).
Jan Vanhellemont, Eiji Kamiyama, Koji Sueoka, "Silicon Single Crystal Growth from a Melt: On the Impact of Dopants on the v/G Criterion, ECS Journal of Solid State Science and Technology", The Electrochemical Society, 2(4), pp. 166-179, (2013).
T. Ono, E. Asayama, H. Horie, M. Hourai, K. Sueoka, H. Tsuya, G. A. Rozgoni, "Effect of Heavy Boron Doping on Oxide Precipitate Growth in Czochralski Silicon", Journal of Electrochemical Society, vol. 146 (6), pp. 2239-2244, (1999).
K. Sueoka, M. Yonemura, M. Akatsuka, H. Katahama, T. Ono, E. Asayama, "Effect of Heavy Boron Doping on Oxygen Precipitation in Czochralski Silicon Substrates of Epitaxial Wafers", The Electrochemical Society proceedings, vol. 99-1, pp. 253-267, (1999).
X. Yu, X. Ma, C. Li, J. Yang, D. Yang, "Grown-in Defects in Heavily Boron Doped Czochralski Silicon", Japanese Journal of Applied Physics, vol. 43 (7A), pp. 4082-4086, (2004).
T. Ono, G.A. Rozgonyi, E. Asayama, H. Horie, H. Tsuya, K. Sueoka, "Oxygen Diffusion In Heavily Antimony-, Arsenic-, and Boron-Doped Czochralski Silicon", Applied Physics Letters, vol. 74 (24), pp. 3648-3650, (1999).
K. Torigoe, J. Fujise, T. Ono, K. Nakamura, "Enhanced Diffusion of Oxygen Depending on Fermi Level Position in Heavily Boron-Doped Silicon", Journal of Applied Physics, vol. 116 (193503), pp. 1-5, (2014).
W. Von Ammon, A Sattler, G. Kissinger, "Defects in Monocrystalline Silicon", Springer Handbook of Electronic and Photonic Materials, S. Kasap, P. Capper (Eds), pp. 111-132, (2017).
U. Gösele, T.Y. Tan, "The Role of Vacancies and Self-Interstitials in Diffusion and Agglomeration Phenomena in Silicon", Electrchemical Society Proceedings, vol. 198304, pp. 17-36, (1983).
H. Susanto, T. Sinno, R.A. Brown, "Influence of Boron on OSF-Ring Dynamics in Czochralski Silicon", Electrochemical Society Proceedings, vol. 1999-01, pp. 479-490, (1999).
H. Takeno, K. Aihara, Y. Hayamizu, Y. Kitagawara, "Influence of Heavy Boron Doping on Oxygen Precipitation Characteristics of Chochralski Silicon Crystals and It's Computer Simulation", Electrochemical Society Proceedings, vol. 1998-1, pp. 1012-1022, (1998).
E. Asayama, T. Ono, M. Takeshita, M. Hourai, M. Sano, H. Tsuya, "Radial Distribution of Thermally-Induced Defects in Heavily Boron-Doped Silicon Wafers", Electrochemical Society Proceedings, vol. 1998-01, pp. 546-556, (1998).
L. Válek, D. Lysáček, J. Šik, "OISF Pattern and Grown-in Precipitates in Heavily Boron Doped Silicon", Journal of Electrochemical Society, vol. 154 (10), pp. 904-909, (2007).
ISR and Written Opinion for International Application No. PCT/EP2020/087962, 10 pages, dated Jul. 20, 2021.

\* cited by examiner

METHODS FOR FORMING A SILICON SUBSTRATE WITH REDUCED GROWN-IN NUCLEI FOR EPITAXIAL DEFECTS AND METHODS FOR FORMING AN EPITAXIAL WAFER

CROSS-REFERENCE TO RELATED APPLICATION

This application is a Divisional of U.S. patent application Ser. No. 17/125,590, filed Dec. 17, 2020, which claims the benefit of U.S. Provisional Patent Application No. 63/112,424, filed Nov. 11, 2020. Both of these applications are incorporated herein by reference in their entirety.

FIELD OF THE DISCLOSURE

The field of the disclosure relates to preparation of single crystal silicon substrates for epitaxial growth and to methods for forming an epitaxial wafer.

BACKGROUND

Epitaxial wafers include a single crystal silicon substrate with an epitaxial layer deposited on the front surface of the substrate. Epitaxial wafers may be used to form electronic devices suitable in microelectronic (integrated circuits or power applications) or photovoltaic use.

Epitaxial wafers may have surface defects which degrade their performance. Some defects formed in the silicon substrate are not dissolved during the epitaxial process and are believed to lead to grown-in defect sites in the epitaxial layer (e.g., epi-stacking faults or "hillocks") following epitaxial deposition. Defect propagation through the epitaxial layer is believed to cause these grown-in defects to form. A thicker epitaxial layer, instead of covering the substrate defects, enlarges the size of the starting substrate surface defects due to the silicon epitaxial growth mode along <111> crystallographic planes, causing larger and more visible epitaxial defects to form with increasing epitaxial layer thickness.

A need exists for methods for reducing the number of grown-in nuclei for epitaxial defects in substrate wafers and for related methods for forming an epitaxial wafer.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for forming a silicon substrate with reduced grown-in nuclei for epitaxial defects. The silicon substrate is boron doped at a concentration of at least $2.8 \times 10^{18}$ atoms/cm$^3$. An initial charge of polycrystalline silicon is added to a crucible. The crucible comprising the initial charge of polycrystalline silicon is heated to cause a silicon melt to form in the crucible. Boron is added to the crucible to produce a doped silicon melt. A silicon seed crystal is contacted with the doped silicon melt. The silicon seed crystal is withdrawn to grow a single crystal silicon ingot having a constant diameter portion. A segment of the constant diameter portion of the ingot has a boron concentration of at least about $2.8 \times 10^{18}$ atoms/cm$^3$. When the segment has a boron concentration from $2.8 \times 10^{18}$ atoms/cm$^3$ to $5.4 \times 10^{18}$ atoms/cm$^3$, (i) a growth velocity, v, and/or (ii) an axial temperature gradient, G, is controlled during the growth of the segment such that v/G is less than 0.20 mm$^2$/(min*K). When the segment has a boron concentration from $5.4 \times 10^{18}$ atoms/cm$^3$ to $8.0 \times 10^{18}$ atoms/cm$^3$, (i) a growth velocity, v, and/or (ii) an axial temperature gradient, G, is controlled during the growth of the segment such that v/G is less than 0.25 mm$^2$/(min*K). When the segment has a boron concentration greater than $8.0 \times 10^{18}$ atoms/cm$^3$, (i) a growth velocity, v, and/or (ii) an axial temperature gradient, G, are operated at any value of v/G. The segment of the constant diameter portion of the ingot is cooled from its solidification temperature to 950° C. or less. The dwell time the segment of the constant diameter portion of the ingot is in the temperature range from 1150° C. to 950° C. is less than 160 minutes.

Yet another aspect of the present disclosure is directed to a method for forming a silicon substrate with reduced grown-in nuclei for epitaxial defects. An initial charge of polycrystalline silicon is added to a crucible. The crucible comprising the initial charge of polycrystalline silicon is heated to cause a silicon melt to form in the crucible. Boron is added to the crucible to prepare a doped silicon melt having a boron concentration of at least $3.8 \times 10^{18}$ atoms/cm$^3$. A silicon seed crystal is contacted with the doped silicon melt. The silicon seed crystal is withdrawn to grow a single crystal silicon ingot. The ingot has a constant diameter portion. The method further includes controlling (i) a growth velocity, v, and/or (ii) an axial temperature gradient, G, during the growth of a segment of the constant diameter portion of the ingot such that the ratio v/G is less than a critical v/G. The segment of the constant diameter portion of the ingot is cooled from its solidification temperature to 950° C. or less. The dwell time the segment of the constant diameter portion of the ingot is in the temperature range from 1150° C. to 950° C. is less than 160 minutes.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
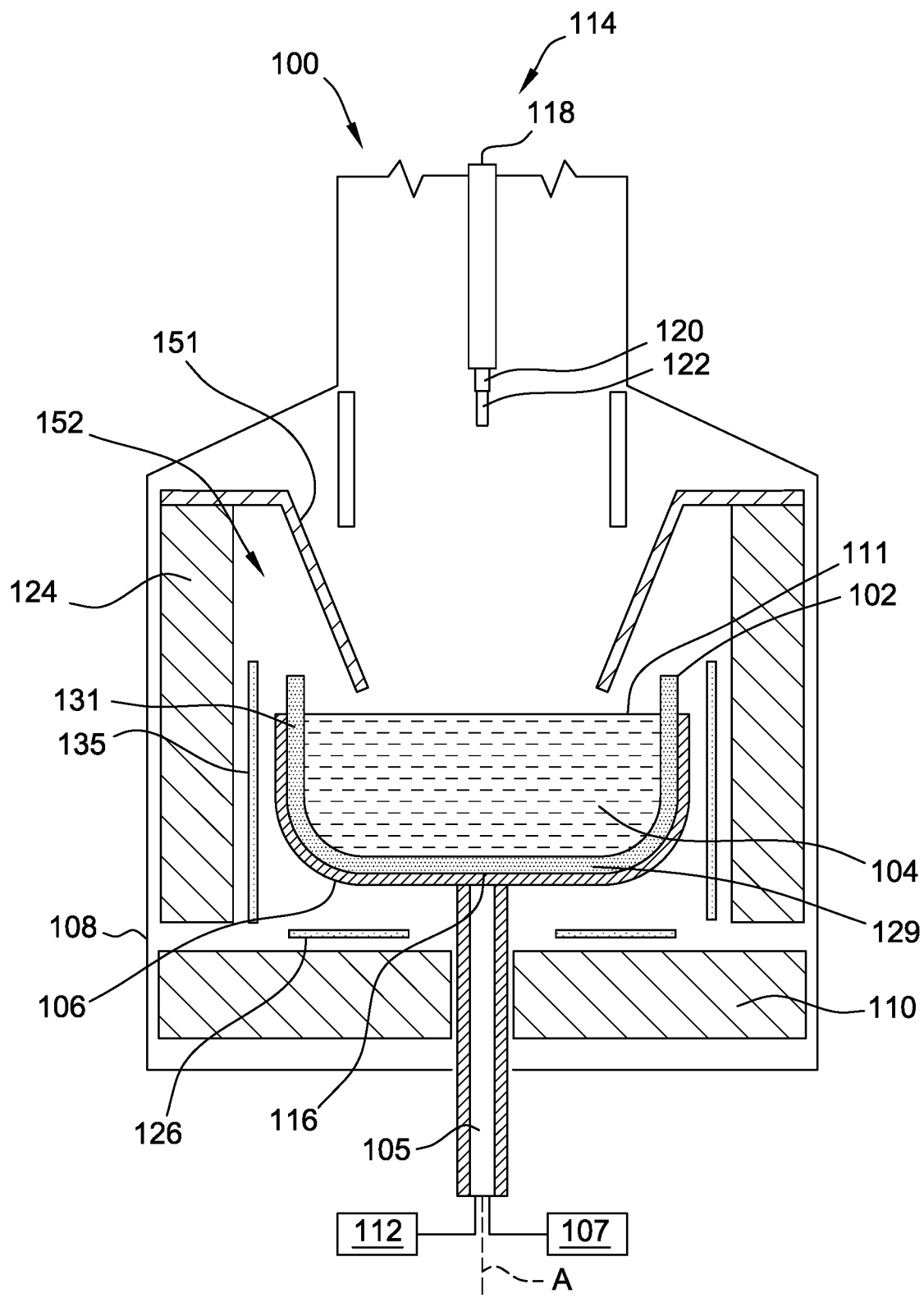
FIG. 1 is a cross-section of an ingot puller apparatus before silicon ingot growth.

Provisions of the present disclosure relate to methods for forming a silicon substrate with reduced grown-in nuclei for epitaxial defects (i.e., defects that occur after epitaxial silicon growth on a silicon substrate). In accordance with embodiments of the present disclosure, the ratio (v/G) of the growth velocity (v) and the axial temperature gradient (G) may be controlled during growth of a segment or all of the constant diameter portion of the ingot and the period of time at which the segment is at the temperature range from 1150° C. to 950° C. is controlled to be 160 minutes or less to reduce the nuclei that lead to defects during epitaxial growth. The resulting substrate is suitable for epitaxial silicon growth with the epitaxial layer grown on the substrate having reduced or being substantially free of grown-in defects.

The methods of the present disclosure may generally be carried out in any ingot puller apparatus that is configured to pull a single crystal silicon ingot. An example ingot puller apparatus (or more simply "ingot puller") is indicated generally at "100" in FIG. 1. The ingot puller apparatus 100 includes a crucible 102 for holding a melt 104 of semiconductor or solar-grade material, such as silicon, supported by a susceptor 106. The ingot puller apparatus 100 includes a crystal puller housing 108 that defines a growth chamber 152 for pulling a silicon ingot 113 (FIG. 2) from the melt 104 along a pull axis A.

The crucible 102 includes a floor 129 and a sidewall 131 that extends upward from the floor 129. The sidewall 131 is generally vertical. The floor 129 includes the curved portion of the crucible 102 that extends below the sidewall 131. Within the crucible 102 is a silicon melt 104 having a melt surface 111 (i.e., melt-ingot interface).

In some embodiments, the crucible 102 is layered. For example, the crucible 102 may be made of a quartz base layer and a synthetic quartz liner disposed on the quartz base layer.

The susceptor 106 is supported by a shaft 105. The susceptor 106, crucible 102, shaft 105 and ingot 113 (FIG. 2) have a common longitudinal axis A or "pull axis" A.

A pulling mechanism 114 is provided within the ingot puller apparatus 100 for growing and pulling an ingot 113 from the melt 104. Pulling mechanism 114 includes a pulling cable 118, a seed holder or chuck 120 coupled to one end of the pulling cable 118, and a silicon seed crystal 122 coupled to the seed holder or chuck 120 for initiating crystal growth. One end of the pulling cable 118 is connected to a pulley (not shown) or a drum (not shown), or any other suitable type of lifting mechanism, for example, a shaft, and the other end is connected to the chuck 120 that holds the seed crystal 122. In operation, the seed crystal 122 is lowered to contact the melt 104. The pulling mechanism 114 is operated to cause the seed crystal 122 to rise. This causes a single crystal ingot 113 (FIG. 2) to be withdrawn from the melt 104.

Figure 2:
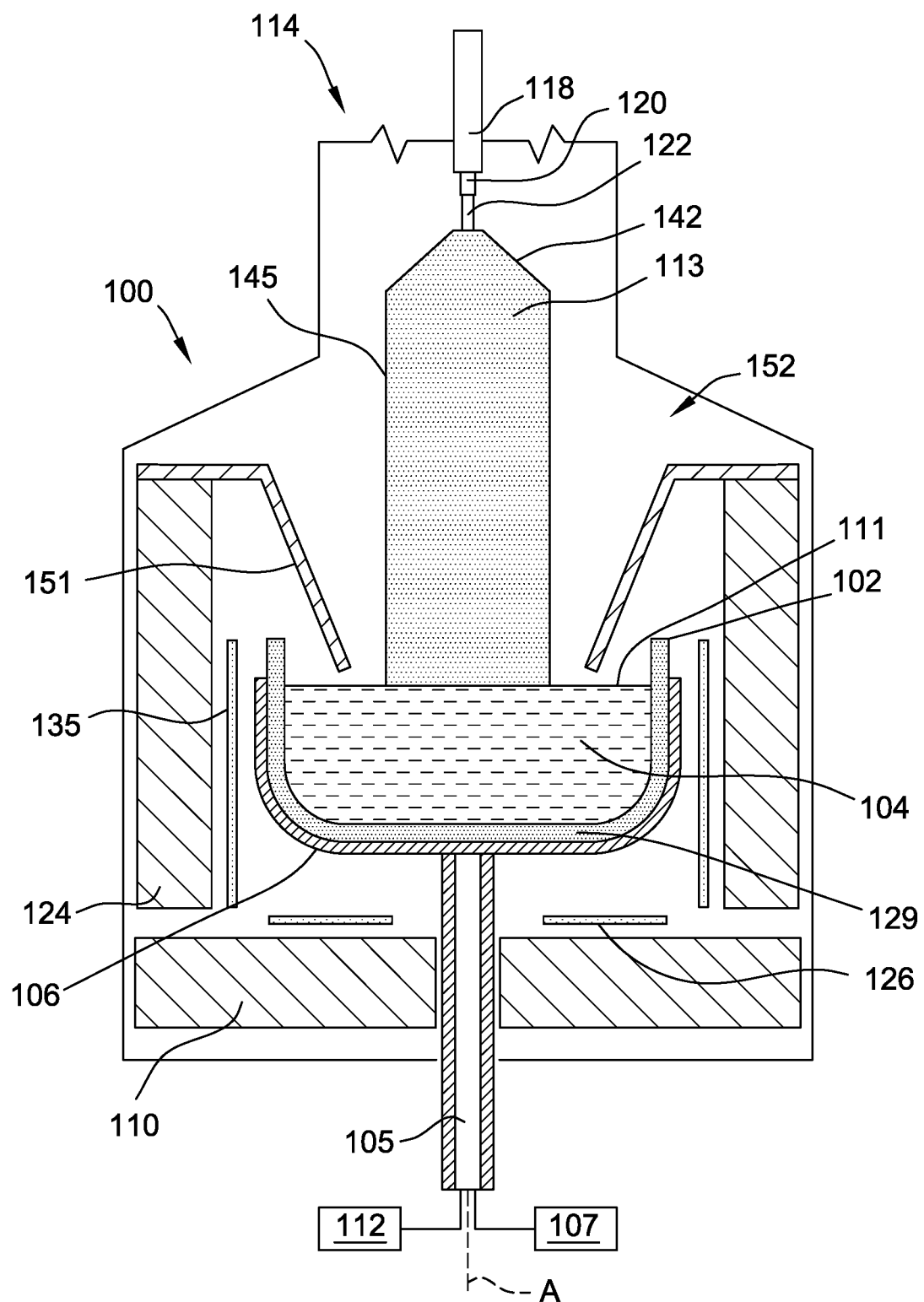
FIG. 2 is a cross-section of an ingot puller apparatus of FIG. 1 during silicon ingot growth.

During heating and crystal pulling, a crucible drive unit 107 (e.g., a motor) rotates the crucible 102 and susceptor 106. A lift mechanism 112 raises and lowers the crucible 102 along the pull axis A during the growth process. For example, as shown in FIG. 1, the crucible 102 may be at a lowest position (near the bottom heater 126) in which an initial charge of solid-phase polycrystalline silicon previously added to the crucible 102 is melted. Crystal growth commences by contacting the melt 104 with the seed crystal 122 and lifting the seed crystal 122 by the pulling mechanism 114. As the ingot grows, the silicon melt 104 is consumed and the height of the melt in the crucible 102 decreases. The crucible 102 and susceptor 106 may be raised to maintain the melt surface 111 at or near the same position relative to the ingot puller apparatus 100 (FIG. 2).

A crystal drive unit (not shown) may also rotate the pulling cable 118 and ingot 113 (FIG. 2) in a direction opposite the direction in which the crucible drive unit 107 rotates the crucible 102 (e.g., counter-rotation). In embodiments using iso-rotation, the crystal drive unit may rotate the pulling cable 118 in the same direction in which crucible drive unit 107 rotates the crucible 102. In addition, the crystal drive unit raises and lowers the ingot 113 relative to the melt surface 111 as desired during the growth process.

The ingot puller apparatus 100 may include an inert gas system to introduce and withdraw an inert gas such as argon from the growth chamber 152. The ingot puller apparatus 100 may also include a dopant feed system (not shown) for introducing dopant into the melt 104.

According to the Czochralski single crystal growth process, a quantity of polycrystalline silicon, or polysilicon, is charged to the crucible 102. The initial semiconductor or solar-grade material that is introduced into the crucible is melted by heat provided from one or more heating elements to form a silicon melt in the crucible. The ingot puller apparatus 100 includes bottom insulation 110 and side insulation 124 to retain heat in the puller apparatus. In the illustrated embodiment, the ingot puller apparatus 100 includes a bottom heater 126 disposed below the crucible floor 129. The crucible 102 may be moved to be in relatively close proximity to the bottom heater 126 to melt the polycrystalline charged to the crucible 102.

To form the ingot, the seed crystal 122 is contacted with the surface 111 of the melt 104. The pulling mechanism 114 is operated to pull the seed crystal 122 from the melt 104. Referring now to FIG. 2, the ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104.

The ingot puller apparatus 100 includes a side heater 135 and a susceptor 106 that encircles the crucible 102 to maintain the temperature of the melt 104 during crystal growth. The side heater 135 is disposed radially outward to the crucible sidewall 131 as the crucible 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system (not shown) so that the temperature of the melt 104 is controlled throughout the pulling process.

The ingot puller apparatus 100 may include a heat shield 151. The heat shield 151 may shroud the ingot 113 and may be disposed within the crucible 102 during crystal growth (FIG. 2).

In some embodiments, the silicon substrate that is produced by the methods described herein is doped (e.g., relatively heavily doped) with boron. For example, the silicon melt may be doped with boron to produce a doped silicon ingot having a boron concentration of at least $2.8 \times 10^{18}$ atoms/cm³. Boron doping of the melt at a concentration of at least $3.8 \times 10^{18}$ atoms/cm³ may be used to achieve an ingot with a concentration of at least $2.8 \times 10^{18}$ atoms/cm³ at the seed end. The resulting ingot (and sliced wafers) may have a concentration of boron of at least $2.8 \times 10^{18}$ atoms/cm³. In some embodiments, the melt is not doped with carbon (and in some embodiments no dopant other than boron is used).

In accordance with embodiments of the present disclosure, a silicon substrate having a reduced amount of grown-in nuclei for epitaxial defects or even a substrate substantially free of such grown-in nuclei may be produced by (1) controlling the ratio of the crystal pull-rate (v) to the magnitude of the axial temperature gradient (G) in the vicinity of the melt-crystal interface and (2) controlling the period of time (i.e., dwell time) at which the segment is at the temperature range from 1150° C. to 950° C. to be 160 minutes or less.

By controlling the ratio of v/G during silicon growth, the type of dominant defect may be controlled. At a higher v/G, the convection of the point defects dominates their diffusion, and vacancies remain the incorporated dominant point defects, as the vacancy concentration at the interface is higher than the interstitial concentration. At a lower v/G, the diffusion dominates the convection, allowing the incorporation of the fast diffusing interstitials as the dominant point points. At a v/G close to its critical value (i.e., the transition between vacancy and interstitial dominated material), both the point defects are incorporated in very low and comparable concentrations.

In accordance with embodiments of the present disclosure, (i) a growth velocity, v, and/or (ii) an axial temperature gradient, G, may be controlled during the growth of an axial segment of the constant diameter portion of the ingot such that the ratio v/G is below the critical value of v/G to cause vacancy concentrations in the ingot to be reduced (or even controlled to be less than a value slightly above the critical v/G).

The critical v/G generally changes based on the amount of boron doping. Boron shifts the equilibrium to the interstitial regime. With increasing boron concentration (i.e., decreasing resistivity), the vacancy-dominated region shrinks until it disappears entirely at the crystal center (FIG. 3C). In boron doped ingots, it is believed that the vacancy-dominated region may be eliminated at boron doping greater than $8.0 \times 10^{18}$ atoms/cm³ (e.g., resistivity of less than 10 mΩ*cm) at all ratios of v/G.

For boron concentrations of $8.0 \times 10^{18}$ atoms/cm³ or less, v/G may be controlled to be below the critical v/G (or even below a value that is slightly above the critical v/G). In accordance with some embodiments of the present disclosure, when the segment of the constant diameter portion of the ingot has a boron concentration from $2.8 \times 10^{18}$ atoms/cm³ to $5.4 \times 10^{18}$ atoms/cm³, (i) the growth velocity, v, and/or (ii) the axial temperature gradient, G, is controlled such that v/G is less than 0.20 mm²/(min*K). When the segment of the constant diameter portion of the ingot has a boron concentration from $5.4 \times 10^{18}$ atoms/cm³ to $8.0 \times 10^{18}$ atoms/cm³, (i) the growth velocity, v, and/or (ii) the axial temperature gradient, G, is controlled during the growth of the segment such that v/G is less than 0.25 mm²/(min*K).

As noted above, when the segment is doped at a concentration of greater than $8.0 \times 10^{18}$ atoms/cm³, v/G need not be controlled as interstitials are the dominant point defect throughout the segment over all ranges of v/G (i.e., any technologically feasible v/G may be used).

As v/G is generally highest at the center of the ingot, the ranges of v/G provided herein are generally measured at the center of the ingot to ensure that v/G is below the upper limit across the entire radius of the ingot.

As the ingot is withdrawn from the melt, the ingot cools from solidification (about 1412° C.) to room temperature. In accordance with embodiments of the present disclosure, during growth of the ingot and control of v/G (v/G being controlled for boron doping at $8.0 \times 10^{18}$ atoms/cm³ or less, i.e., resistivities above 10 mΩ*cm), the cooling rate of the ingot is controlled such that the dwell time at which the segment (e.g., each portion of the segment) is in the temperature range from 1150° C. to 950° C. is minimized. In this regard, all ingots may be controlled in this manner regardless of the boron doping concentration. In accordance with some embodiments, the cooling rate of the ingot is controlled such that the period of time at which the segment is in the temperature range from 1150° C. to 950° C. is less than 160 minutes.

The hot zone of the ingot puller may be arranged and/or modified to achieve such a cooling rate through this range of temperatures (e.g., cooling rate at least 1.25° C./minute, at least 1.5° C./minute, at least 2.0° C./min, at least 2.5° C./min, at least 3.0° C./min, or at least 3.5° C./min through the 1150° C. to 950° C. temperature range). Hot zones that may achieve such cooling may include any combination of one or more of the following: (1) active cooling elements (e.g., water cooling) near the ingot surface, (2) increasing thermal insulation between the crystal surface and the melt to reduce heat radiation from the melt to the crystal, (3) application of a jet of cold inert gas near the melt-ingot interface, (4) use of a conical heat shield (e.g., reflective material such as molybdenum) that surrounds the ingot to reflect heat irradiated by the ingot toward the ingot puller apparatus walls. In other embodiments, the cooling rate of the ingot is controlled such that the period of time at which the segment is in the temperature range from 1150° C. to 950° C. is less than 120 minutes, less than 90 minutes or less than 60 minutes.

As noted above, v/G may be controlled such that interstitials are the dominant intrinsic point defect and with the cooling rate being controlled such that the ingot segment is in the temperature range from 1150° C. to 950° C. for less than 160 minutes for at least a segment (e.g., axial segment) of the ingot. This segment of the ingot may have a length that is at least 0.5 times the length (D) of the constant diameter portion of the ingot (0.5*D). In other embodiments, the length of the segment is at least 0.75*D or at least 0.9*D. In some embodiments, the segment is the entire constant diameter portion of the ingot.

Once the ingot has been grown, the ingot is sliced into substrates (i.e., wafers). The resulting wafers have a reduced amount of grown-in nuclei for epitaxial defects that form during epitaxial growth.

Once the wafers have been sliced from the ingot and processed (e.g., various smoothing and/or reduction in surface roughness), an epitaxial layer may be deposited on the front surface of the substrate by contacting the front surface with a silicon-containing gas that decomposes and forms an epitaxial silicon layer on the substrate. Generally, any of the methods available to those of skill in the art for depositing a silicon epitaxial layer on a silicon substrate may be used unless stated otherwise. Silicon may be deposited by epitaxy to any suitable thickness depending on the device application. For example, the silicon may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). Silicon precursors (i.e., silicon-containing gases) for LPCVD or PECVD include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. For example, silicon may be deposited onto the surface by pyrolyzing silane ($SiH_4$) in a temperature range between about 550° C. and about 690° C., such as between about 580° C. and about 650° C. The chamber pressure may range from about 70 to about 400 mTorr.

A boron-containing gas may be introduced into the epitaxial reactor to dope the epitaxial layer with boron. In some embodiments, the resulting epitaxial structure (i.e., substrate and epitaxial layer) is doped with boron at concentrations sufficient to achieve a p/p+ epitaxial wafer. The epitaxial layer may have a reduced number of grown-in defects or may be substantially free of grown-in defects.

Compared to other methods for forming a substrate for silicon epitaxial growth and methods for forming an epitaxial wafer, the methods of the present disclosure have several advantages. Heavily doping the substrate with boron (e.g., a boron concentration of $2.8 \times 10^{18}$ atoms/$cm^3$ or more) has been found to suppress the formation of interstitial-type dislocation loops. Heavily doping the substrate with boron has also been found to enhance oxygen precipitation. In vacancy rich regions, oxygen precipitation is further enhanced (i.e. larger precipitates form). Enhancement increases with higher vacancy concentrations. It is believed that grown-in defects in the epitaxial layer deposited on a substrate heavily-doped with boron are significantly caused by large oxygen precipitates at the surface of the single crystal silicon substrate upon which the epitaxial layer is grown. These large oxygen precipitates, which may be associated with dislocation loops or tangles, are not dissolved during the epitaxial process and are believed to lead to defect sites in the epitaxial layer (e.g., epi-stacking faults or "hillocks") following epitaxial deposition. By keeping v/G below the critical value (or in a slight excess) in the relatively heavily-doped substrate, vacancies are eliminated or reduced, respectively, which suppresses the formation of relatively large oxygen precipitates which do not dissolve during epitaxial deposition. Thus it may be seen that relatively high boron doping with control of v/G below threshold values thereby reduces defects attributable to interstitials and vacancies.

In embodiments in which the ingot segment has a boron concentration of greater than $8.0 \times 10^{18}$ atoms/$cm^3$, the segment is fully interstitial rich and any ratio of v/G may be used. By controlling the ratio of v/G instead of only the pull rate v, process productivity may be preserved (e.g., by use of hot zone configured to provide high values of the thermal gradient G).

By minimizing the time the ingot segment is in the temperature range from 1150° C. to 950° C. (e.g., a dwell time of 160 minutes or less), defects may be further reduced or eliminated regardless of the v/G value, even if vacancies are present.

EXAMPLES

The processes of the present disclosure are further illustrated by the following Examples. These Examples should not be viewed in a limiting sense.

Figure 3:
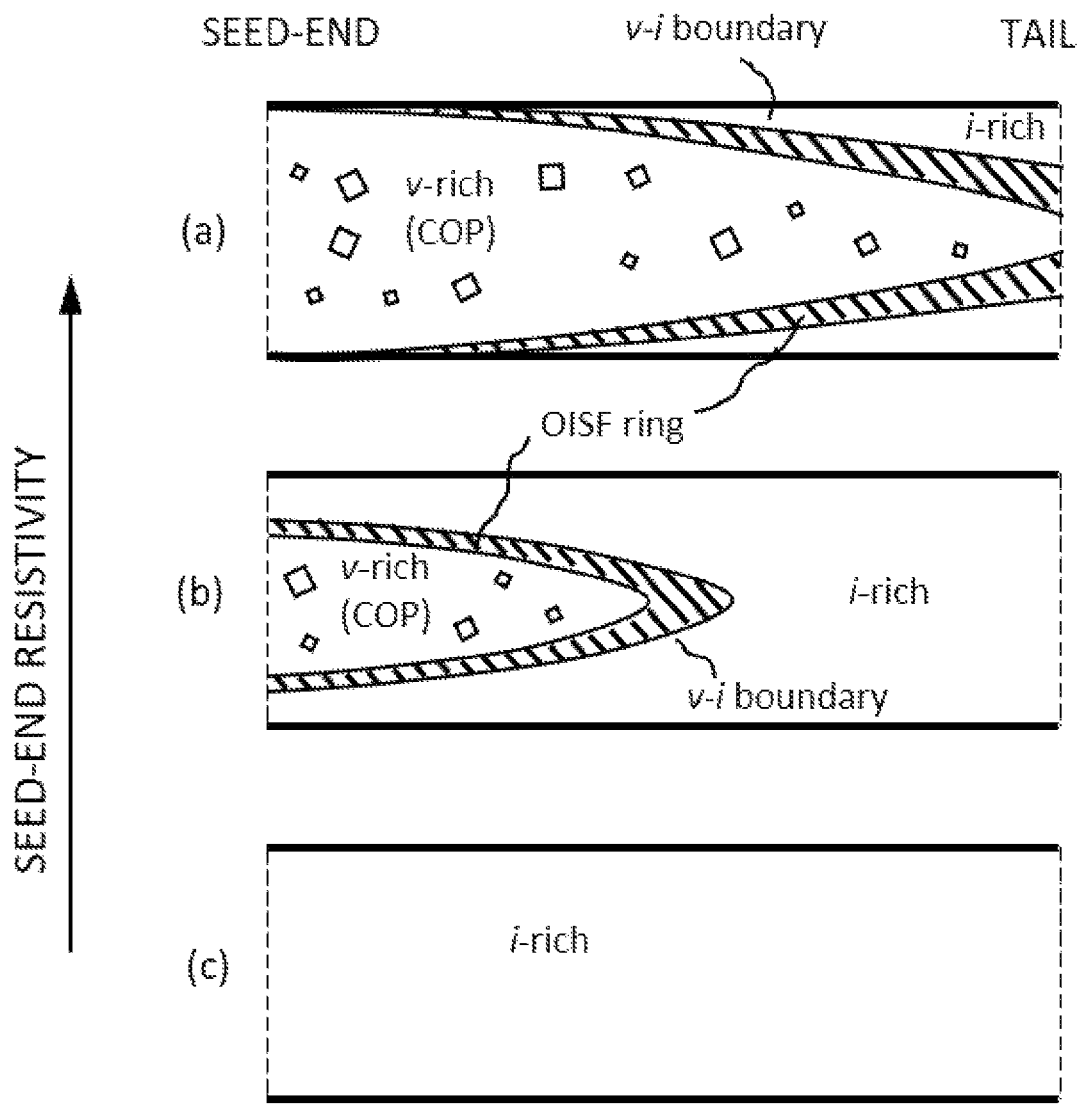
FIG. 3 are schematic cross-section views of a single crystal silicon ingot showing the axial trend in vacancy-rich and interstitial-rich regions for three boron doping levels (increasing from (a) to (c))

Example 1: Axial Trends in Vacancy-Rich and Interstitial-Rich Regions of a Silicon Ingot at Different Boron Doping Levels FIG. 3 is a cross-section schematic view of a single crystal silicon ingot showing the axial trend in vacancy-rich and interstitial-rich regions for three boron doping levels. FIG. 3(a) shows the axial trend of the vacancy-rich and interstitial-rich regions for a silicon crystal heavily doped with boron (e.g., relatively light doping at $2.8 \times 10^{18}$ atoms/$cm^3$ which corresponds to a target resistivity at the seed end of 22 mΩ*cm which is a typical specification for heavily boron doped silicon substrates). In the crystal of FIG. 3(a), at the crystal seed end, the vacancy-rich region extends across the entire crystal radius, from center to edge, and shrinks gradually along the crystal length as the boron concentration increases axially due to the dopant segregation. At the V/I boundary, the position of the OISF ring is also shown. The OISF ring vanishes where the vacancy-rich region shrinks completely.

FIG. 3(b) shows the axial trend of the vacancy-rich and interstitial-rich regions for a silicon crystal heavily doped with boron to an intermediate concentration (e.g., relatively intermediate doping at $4.5 \times 10^{18}$ atoms/$cm^3$ at the seed end which corresponds to a target resistivity at the seed end of 16 mΩ*cm which is a resistivity that represents a typical intermediate resistivity specification for heavily boron doped silicon substrates). In this example, the vacancy-rich region extends only until a certain distance from the center even at the crystal seed end. The vacancy-rich region gradually shrinks along the crystal length as the boron concentration increases axially due to the dopant segregation and vanishes completely at some axial position. At the V/I boundary, the position of the OISF ring is also shown. The OISF ring vanishes where the vacancy-rich region shrinks completely.

FIG. 3(c) shows the axial trend of the vacancy-rich and interstitial-rich regions for a silicon crystal heavily doped with boron (e.g., relatively high doping at $8.0 \times 10^{18}$ atoms/$cm^3$ at the seed end which corresponds to a target resistivity at the seed end of about 10 mΩ*cm which is a typical resistivity specification for heavily boron doped crystals used to cover the common p++ range of 5-10 mΩ*cm). The defect pattern of FIG. 3(c) does not change for even lower resistivities such as 5 mΩ*cm. No vacancy-rich region is present and the crystal is fully interstitial rich. No OISF ring forms. At this high doping level, no impact of the v/G ratio is observed and it can be concluded that the defect nature is fully determined by the dopant concentration alone.

Example 2: Comparison of Epitaxial Defect Counts Between Wafers from an Ingot Segment with a Relatively Long Time and a Relatively Short Time in the Temperature Range from 1150° C. to 950° C.

Figure 4:
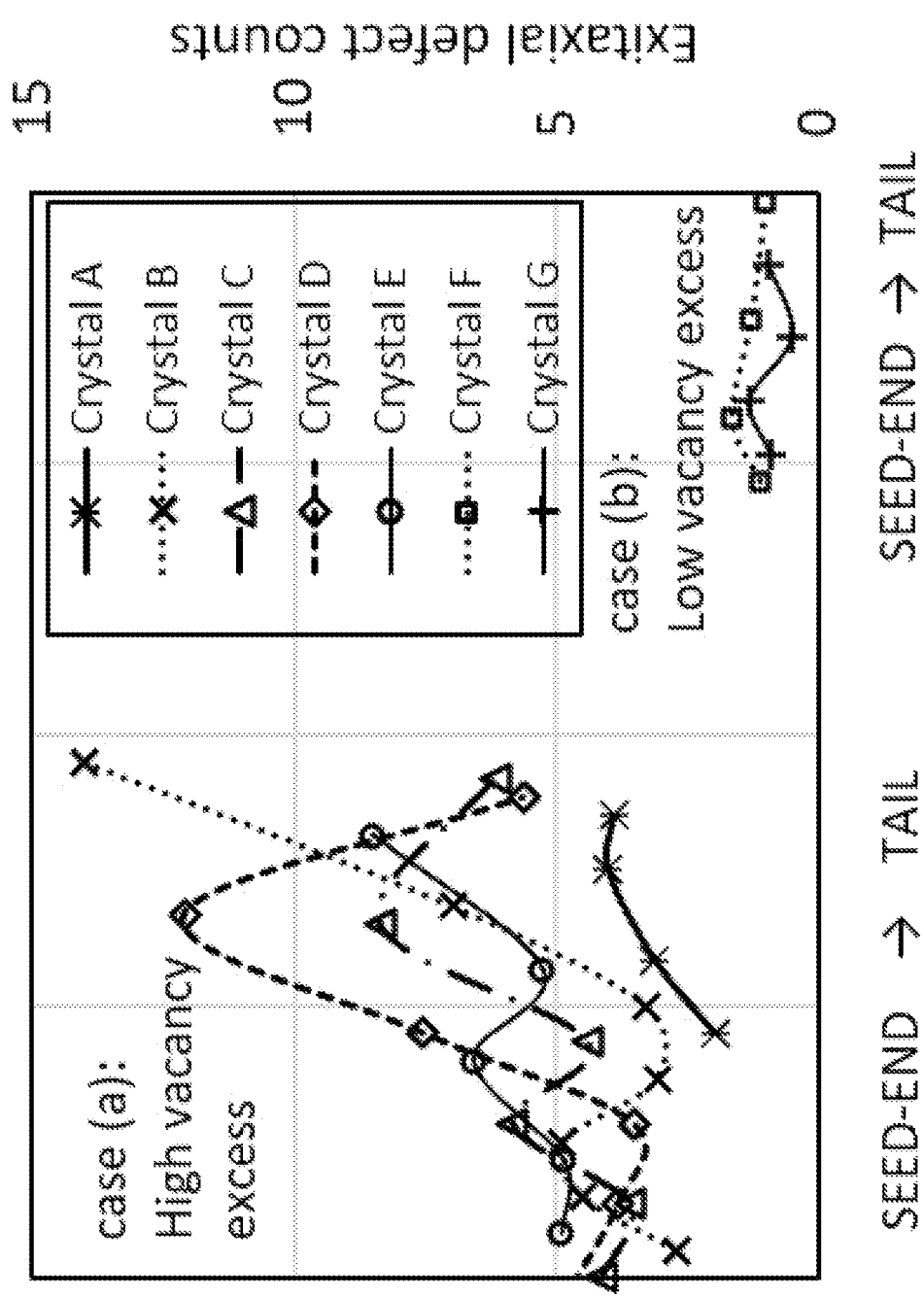
FIG. 4 is a graph of epitaxial defect counts as a function of the axial position of the substrate wafer in the single crystal ingot with a relatively long time in the temperature range from 1150° C. to 950° C.

FIG. 4 is a graph of epitaxial defect counts measured by a laser inspection tool as a function of the axial position of the substrate wafer in the single crystal ingot with a relatively long time in the temperature range from 1150° C. to 950° C. (labeled as "Example 1"). The data points to the left of FIG. 4 are for crystals which were heavily doped with boron at relatively light doping (e.g., $2.8 \times 10^{18}$ atoms/cm$^3$) as shown in FIG. 3(a). The data points to the right of FIG. 4 are for crystals which were heavily doped with boron at relatively intermediate doping (e.g., $4.5 \times 10^{18}$ atoms/cm$^3$) as shown in FIG. 3(b).

Figure 5:
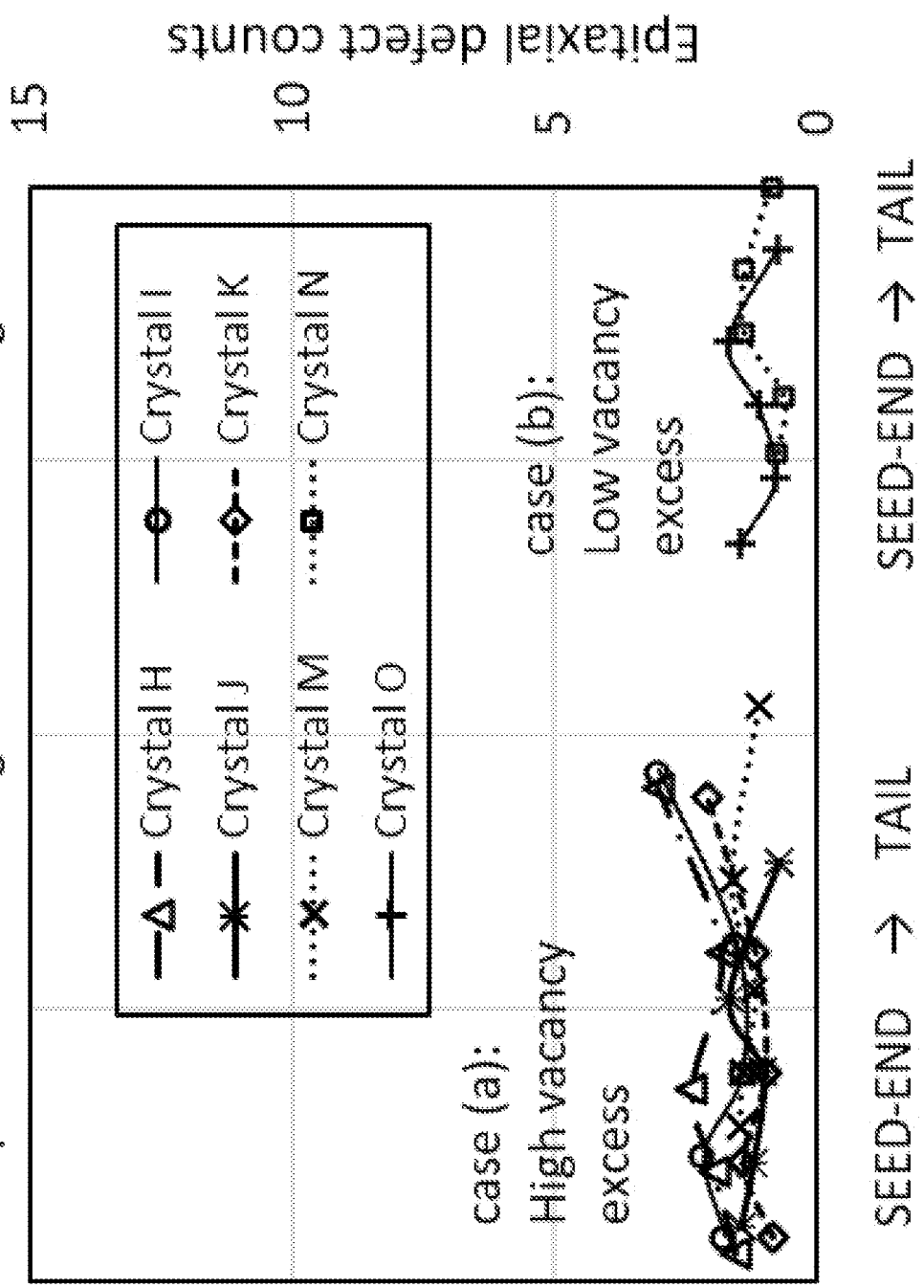
FIG. 5 is a graph of epitaxial defect counts as a function of the axial position of the substrate wafer in the single crystal ingot with a relatively short time in the temperature range from 1150° C. to 950° C.

FIG. 5 is a graph of epitaxial defect counts measured by a laser inspect tool as a function of the axial position of the substrate wafer in the single crystal ingot with a relatively short time in the temperature range from 1150° C. to 950° C. (labeled as "Example 2"). The data points to the left of FIG. 5 are for crystals which were heavily doped with boron at relatively light doping (e.g., $2.8 \times 10^{18}$ atoms/cm$^3$) as shown in FIG. 3(a). The data points to the right of FIG. 5 are for crystals which were heavily doped with boron at relatively intermediate doping such as (e.g., $4.5 \times 10^{18}$ atoms/cm$^3$) as shown in FIG. 3(b).

As shown in FIGS. 4 and 5, shortening the period of time in the temperature range from 1150° C. to 950° C. reduced the number of defects, particularly for more lightly doped substrates.

Figure 6:
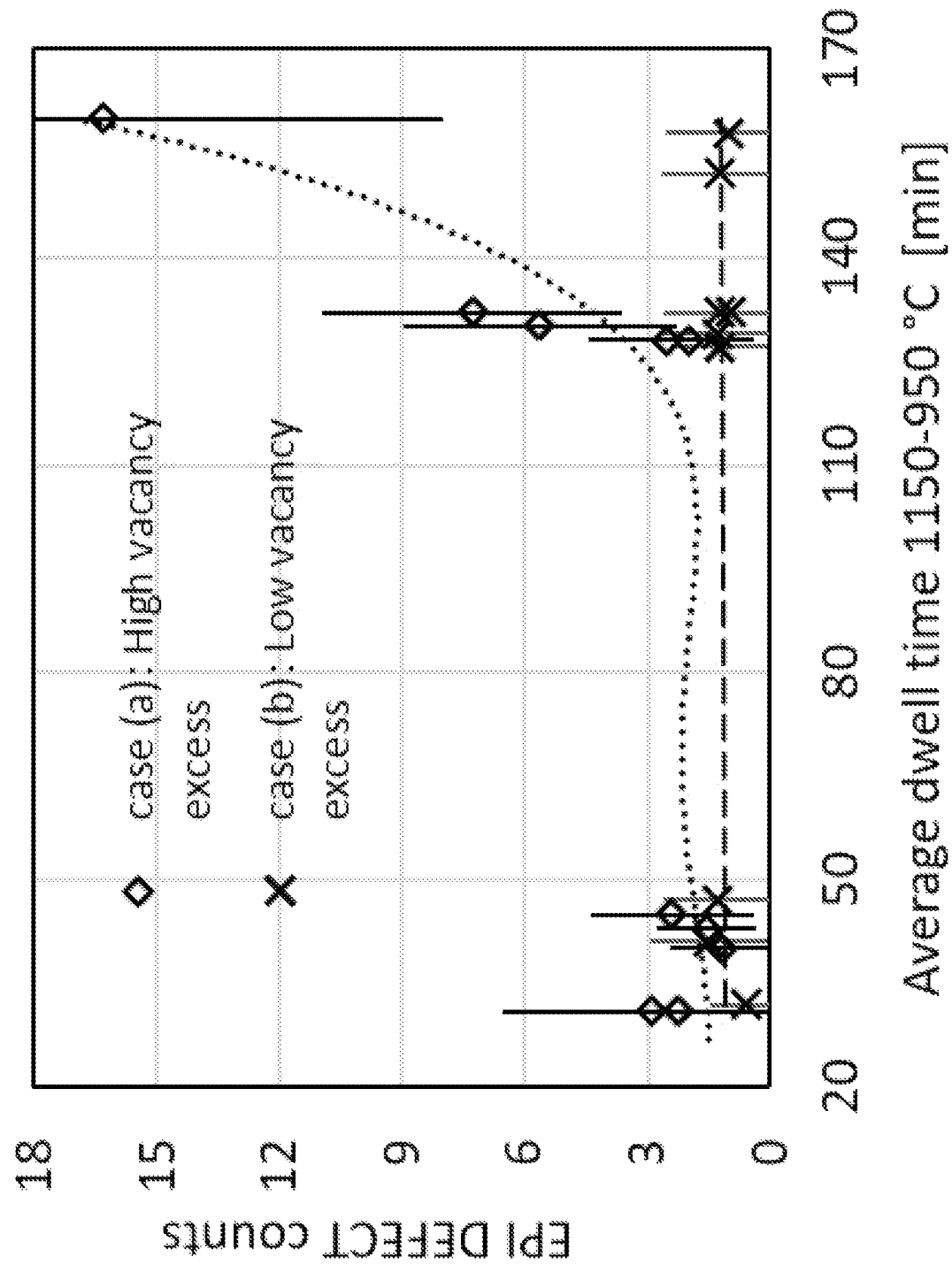
FIG. 6 is a graph of the defect counts as a function of dwell time the ingot segment in the temperature range from 1150° C. to 950° C.

The defect counts of FIGS. 4 and 5 are shown in FIG. 6 as a function of dwell time the ingot segment in the temperature range from 1150° C. to 950° C. Ingot segments with excess vacancy concentration are shown in rhombs and segments grown under a relatively lower vacancy concentration are shown by crosses. As shown in FIG. 6, the epitaxial defects depend on the dwell time the ingot segment is in the temperature range from 1150° C. to 950° C.

Figure 7:
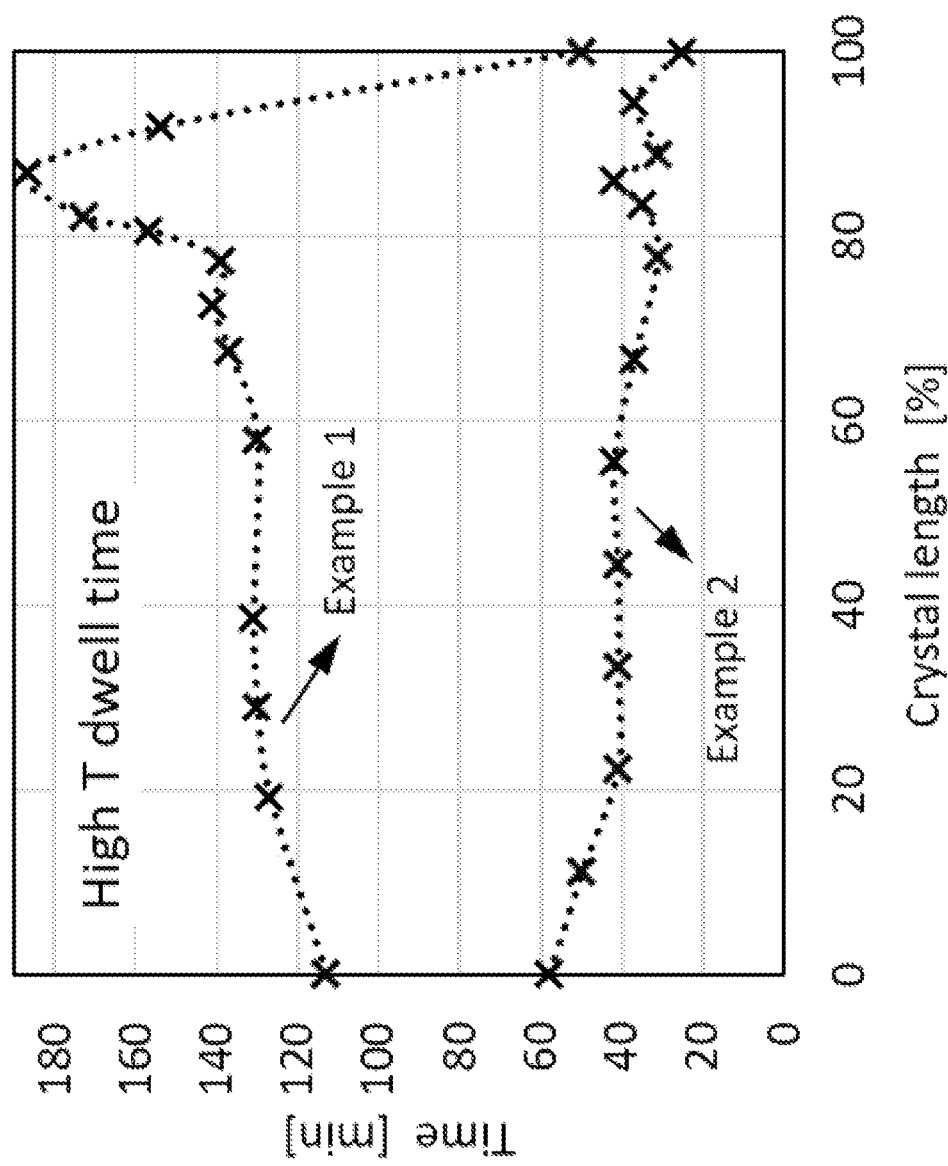
FIG. 7 is a graph of the dwell time over the crystal length for various single crystal silicon ingots.

FIG. 7 shows the dwell time of various ingot segments in the temperature range between 1150° C. to 950° C. Relatively low cooling is indicated as "Example 1" and relatively fast cooling is indicated as "Example 2". An ingot segment having a boron concentration of $4.32\text{-}4.61 \times 10^{18}$ atoms/cm$^3$ and an oxygen concentration of $6.25 \times 10^{17}$ atoms/cm$^3$ was selected. v/G of the segment at its center was about 0.25 mm$^2$/(min*K) which was more than the 0.20 mm$^2$/(min*K) range specified above for the boron concentration of the segment. A segment having a 180 minute dwell time between 1150° C. and 950° C. was chosen. The segment was sliced in wafers and a silicon epitaxial layer was grown on the front surface of each substrate. The epitaxial wafers were measured by a laser inspection tool to determine the defect count. The average epitaxial defect count was 16 per wafer, much higher than the defect count of 3 per wafer that was achieved by embodiments of the present disclosure (see, e.g., FIGS. 5 and 6 and Table 1 below).

FIG. 7 also shows data used to prepare FIG. 4 ("Example 1") and FIG. 5 ("Example 2").

Example 3: Defect Counts as a Function of v/G

Table 1 shows the boron concentration, oxygen concentration target, and dwell time spent in the temperature range from 1150° C. to 950° C. in the crystal segment for various test lots. An epitaxial silicon layer was deposited on each substrate and the epitaxial defect counts as measured with laser inspection tools were measured. In Table 1, "high" excess vacancies indicates that v/G was higher than the v/G ranges specified above (v/G was greater than 0.20 mm$^2$/(min*K) for boron concentrations from $2.8 \times 10^{18}$ atoms/cm$^3$ to $5.4 \times 10^{18}$ atoms/cm$^3$ and was greater than 0.25 for boron concentrations from $5.4 \times 10^{18}$ atoms/cm$^3$ to $8.0 \times 10^{18}$ atoms/cm). "Low" excess vacancies indicate that v/G was less than the v/G ranges specified above (v/G was less than 0.20 mm$^2$/(min*K) for boron concentrations from $2.8 \times 10^{18}$ atoms/cm$^3$ to $5.4 \times 10^{18}$ atoms/cm$^3$ and was less than 0.25 for boron concentrations from $5.4 \times 10^{18}$ atoms/cm$^3$ to $8.0 \times 10^{18}$ atoms/cm$^3$).

TABLE 1

Defect Counts as a Function of v/G (i.e., excess vacancy concentration

| Test Lot Number | Excess Vacancy Conc. | Boron Conc. (Lot Range) [at/cm$^3$] | Oxygen Conc. (target) [at/cm$^3$] | Dwell time 1150-950° C. [min] | Epitaxial defect counts |
|---|---|---|---|---|---|
| 1 | high | $(4.60\text{-}4.75) * 10^{18}$ | $6.45 * 10^{17}$ | 128 | <3 |
| 2 | high | $(4.67\text{-}4.81) * 10^{18}$ | $6.25 * 10^{17}$ | 128 | <3 |
| 3 | high | $(4.32\text{-}4.61) * 10^{18}$ | $6.25 * 10^{17}$ | 160 | >15 |
| 4 | high | $(4.44\text{-}5.00) * 10^{18}$ | $6.25 * 10^{17}$ | 130 | >5 |
| 5 | high | $(4.51\text{-}5.19) * 10^{18}$ | $6.45 * 10^{17}$ | 132 | >5 |
| 6 | low | $(6.05\text{-}6.42) * 10^{18}$ | $6.25 * 10^{17}$ | 127 | <3 |
| 7 | low | $(6.91\text{-}7.52) * 10^{18}$ | $6.25 * 10^{17}$ | 129 | <3 |
| 8 | low | $(8.89\text{-}10.60) * 10^{18}$ | $6.25 * 10^{17}$ | 132 | <3 |
| 9 | low | $(8.83\text{-}10.40) * 10^{18}$ | $6.25 * 10^{17}$ | 132 | <3 |
| 10 | low | $(7.76\text{-}9.58) * 10^{18}$ | $6.25 * 10^{17}$ | 158 | <3 |
| 11 | low | $(7.46\text{-}8.89) * 10^{18}$ | $6.25 * 10^{17}$ | 152 | <3 |
| 12 | high | $(4.68\text{-}4.77) * 10^{18}$ | $6.45 * 10^{17}$ | 45 | <3 |
| 13 | high | $(4.51\text{-}4.62) * 10^{18}$ | $6.25 * 10^{17}$ | 40 | <3 |
| 14 | high | $(4.90\text{-}5.11) * 10^{18}$ | $6.45 * 10^{17}$ | 43 | <3 |
| 15 | high | $(4.82\text{-}4.90) * 10^{18}$ | $6.45 * 10^{17}$ | 31 | <3 |
| 16 | high | $(4.68\text{-}4.88) * 10^{18}$ | $6.25 * 10^{17}$ | 31 | <3 |
| 17 | low | $(5.83\text{-}6.07) * 10^{18}$ | $6.25 * 10^{17}$ | 47 | <3 |
| 18 | low | $(5.95\text{-}6.11) * 10^{18}$ | $6.25 * 10^{17}$ | 41 | <3 |
| 19 | low | $(6.75\text{-}8.12) * 10^{18}$ | $6.25 * 10^{17}$ | 32 | <3 |

As shown in Table 1, low defect counts may be achieved when the excess vacancy concentration is low or when the dwell time in the temperature range from 1150° C. to 950° C. is low (or a combination of these conditions).

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for forming a silicon substrate with reduced grown-in nuclei for epitaxial defects, the silicon substrate being boron doped, the method comprising:
    adding an initial charge of polycrystalline silicon to a crucible;
    heating the crucible comprising the initial charge of polycrystalline silicon to cause a silicon melt to form in the crucible;
    adding boron to the crucible to produce a doped silicon melt;
    contacting a silicon seed crystal with the doped silicon melt;
    withdrawing the silicon seed crystal to grow a single crystal silicon ingot, the ingot having a constant diameter portion, wherein a segment of the constant diameter portion of the ingot has a boron concentration from $2.8 \times 10^{18}$ atoms/cm$^3$ to $5.4 \times 10^{18}$ atoms/cm$^3$;
    controlling (i) a growth velocity, v, and/or (ii) an axial temperature gradient, G, during the growth of the segment such that v/G is less than 0.20 mm$^2$/(min*K) and interstitials are the dominant intrinsic point defect in the segment;
    cooling the segment of the constant diameter portion of the ingot from its solidification temperature to 950° C. or less, wherein the dwell time the segment of the constant diameter portion of the ingot is in the temperature range from 1150° C. to 950° C. is less than 160 minutes; and
    slicing the substrate from the single crystal silicon ingot.

2. The method as set forth in claim 1 wherein the constant diameter portion has a length D, the length of the segment being at least 0.5*D.

3. The method as set forth in claim 1 wherein the dwell time the segment of the constant diameter portion of the ingot is in the temperature range from 1150° C. to 950° C. is less than 120 minutes.

4. The method as set forth in claim 1 wherein the melt is not doped with carbon.

5. The method as set forth in claim 1 wherein the length of the segment is the entire constant diameter portion of the ingot.

6. The method as set forth in claim 1 wherein the dwell time the segment of the constant diameter portion of the ingot is in the temperature range from 1150° C. to 950° C. is less than 60 minutes.

7. A method for preparing an epitaxial structure, the method comprising:
    forming the silicon substrate by the method of claim 1; and
    contacting a front surface of the silicon substrate with a silicon-containing gas, the silicon-containing gas decomposing to form an epitaxial silicon layer on the silicon substrate.

8. The method as set forth in claim 1 wherein a single dopant is added to the melt, the single dopant being boron.

9. A method for forming a silicon substrate with reduced grown-in nuclei for epitaxial defects, the silicon substrate being boron doped, the method comprising:
    adding an initial charge of polycrystalline silicon to a crucible;
    heating the crucible comprising the initial charge of polycrystalline silicon to cause a silicon melt to form in the crucible;
    adding boron to the crucible to produce a doped silicon melt;
    contacting a silicon seed crystal with the doped silicon melt;
    withdrawing the silicon seed crystal to grow a single crystal silicon ingot, the ingot having a constant diameter portion, wherein a segment of the constant diameter portion of the ingot has a boron concentration from $5.4 \times 10^{18}$ atoms/cm$^3$ to $8.0 \times 10^{18}$ atoms/cm$^3$;
    controlling (i) a growth velocity, v, and/or (ii) an axial temperature gradient, G, during the growth of the segment such that v/G is less than 0.25 mm$^2$/(min*K) and interstitials are the dominant intrinsic point defect in the segment;
    cooling the segment of the constant diameter portion of the ingot from its solidification temperature to 950° C. or less, wherein the dwell time the segment of the constant diameter portion of the ingot is in the temperature range from 1150° C. to 950° C. is less than 160 minutes; and
    slicing the substrate from the single crystal silicon ingot.

10. The method as set forth in claim 9 wherein the constant diameter portion has a length D, the length of the segment being at least 0.5*D.

11. The method as set forth in claim 9 wherein the dwell time the segment of the constant diameter portion of the ingot is in the temperature range from 1150° C. to 950° C. is less than 120 minutes.

12. The method as set forth in claim 9 wherein the melt is not doped with carbon.

13. The method as set forth in claim 9 wherein the length of the segment is the entire constant diameter portion of the ingot.

14. The method as set forth in claim 9 wherein the dwell time the segment of the constant diameter portion of the ingot is in the temperature range from 1150° C. to 950° C. is less than 60 minutes.

15. A method for preparing an epitaxial structure, the method comprising:
    forming the silicon substrate by the method of claim 9; and
    contacting a front surface of the silicon substrate with a silicon-containing gas, the silicon-containing gas decomposing to form an epitaxial silicon layer on the silicon substrate.

16. The method as set forth in claim 9 wherein a single dopant is added to the melt, the single dopant being boron.

* * * * *